(12) United States Patent
Park et al.

(10) Patent No.: US 8,074,352 B2
(45) Date of Patent: Dec. 13, 2011

(54) METHOD OF MANUFACTURING PRINTED CIRCUIT BOARD

(75) Inventors: Dong-Jin Park, Seongnam-si (KR); Seung-Hyun Jung, Suwon-si (KR); Seung-Chul Kim, Cheongju-si (KR); Soon-Jin Cho, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 641 days.

(21) Appl. No.: 12/213,365

(22) Filed: Jun. 18, 2008

(65) Prior Publication Data

US 2009/0133253 A1     May 28, 2009

(30) Foreign Application Priority Data

Nov. 26, 2007   (KR) .................. 10-2007-0121079

(51) Int. Cl.
*H05K 3/04*     (2006.01)
*H05K 3/06*     (2006.01)
*H05K 3/42*     (2006.01)

(52) U.S. Cl. ............. 29/847; 29/852; 174/258; 174/264

(58) Field of Classification Search ................... 29/847, 29/852; 174/250, 261, 262, 264, 258; 216/47
See application file for complete search history.

(56) References Cited

U.S. PATENT DOCUMENTS 4,368,503 A * 1/1983 Kurosawa et al. ............ 361/792
6,039,889 A * 3/2000 Zhang et al. ..................... 216/17

FOREIGN PATENT DOCUMENTS

KR       10-0704920 B1      4/2007

* cited by examiner

*Primary Examiner* — Livius R Cazan

(57) ABSTRACT

A method of manufacturing a printed circuit board is disclosed. The method may include: sequentially stacking an acid-resistant first cover layer and an alkali-resistant second cover layer over a copper foil, for a copper clad laminate that includes the copper foil stacked over one side of an insulation layer; forming an intaglio groove by removing portions of the second cover layer, the first cover layer, and the copper clad laminate; stacking a seed layer over the intaglio groove and the second cover layer; removing a portion of the seed layer stacked over the second cover layer, by stripping the second cover layer; forming a plating layer, by plating an inside of the intaglio groove; stripping the first cover layer; and removing the copper foil exposed by the stripping of the first cover layer.

3 Claims, 9 Drawing Sheets

METHOD OF MANUFACTURING PRINTED CIRCUIT BOARD

CROSS-REFERENCE TO RELATED APPLICATIONS

This application claims the benefit of Korean Patent Application No. 10-2007-0121079 filed with the Korean Intellectual Property Office on Nov. 26, 2007, the disclosure of which is incorporated herein by reference in its entirety.

BACKGROUND

1. Technical Field

The present invention relates to a method of manufacturing a printed circuit board having intaglio circuit patterns.

2. Description of the Related Art

With developments in electronic components, fine-line circuit wiring is being employed, in order to provide higher densities in the printed circuit board. This, however, can result in lower adhesion between the metal circuit lines and the insulation, which may cause problems such as the circuit lines being peeled off from the insulation. To improve this, a technique is under development, which includes processing an intaglio groove in the insulation and then filling the groove with metal by a plating process.

The filling of a metal by plating into an intaglio groove having a small width may not pose serious problems even when existing chemicals and processes are employed, but in cases where the width is large, such as the case illustrated in FIG. 1, it can be difficult to obtain a uniform plating thickness using existing techniques, compared to the cases for narrow intaglio grooves. Thus, it may be difficult to obtain a faultless wide circuit pattern 112 without employing a separate leveling process. When an etching process is applied to a plated circuit pattern 112, the inner portion of the intaglio groove can become uncovered, as illustrated in the drawing on the right in FIG. 1.

SUMMARY

One aspect of the invention provides a method of forming circuit patterns in a simple manner without using a photoresist.

Another aspect of the invention provides a method of manufacturing a printed circuit board. The method includes: sequentially stacking an acid-resistant first cover layer and an alkali-resistant second cover layer over a copper foil, for a copper clad laminate that includes the copper foil stacked over one side of an insulation layer; forming an intaglio groove, by removing portions of the second cover layer, the first cover layer, and the copper clad laminate; stacking a seed layer over the intaglio groove and the second cover layer; removing a portion of the seed layer stacked over the second cover layer, by stripping the second cover layer; forming a plating layer, by plating an inside of the intaglio groove; stripping the first cover layer; and removing the copper foil exposed by the stripping of the first cover layer.

The operation of removing the portion of the seed layer can be performed by stripping the second cover layer by physical force.

The removing of the copper foil can include removing the copper foil by etching.

Additional aspects and advantages of the present invention will be set forth in part in the description which follows, and in part will be obvious from the description, or may be learned by practice of the invention.

DETAILED DESCRIPTION

Figure 1:
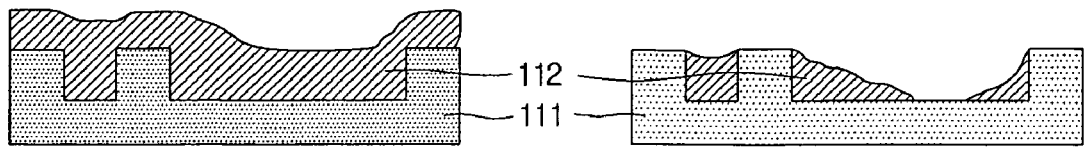
FIG. 1 is a cross-sectional view of a printed circuit board according to the related art.

The method of manufacturing a printed circuit board according to certain embodiments of the invention will be described below in more detail with reference to the accompanying drawings. Those components that are the same or are in correspondence are rendered the same reference numeral regardless of the figure number, and redundant explanations are omitted.

Figure 2:
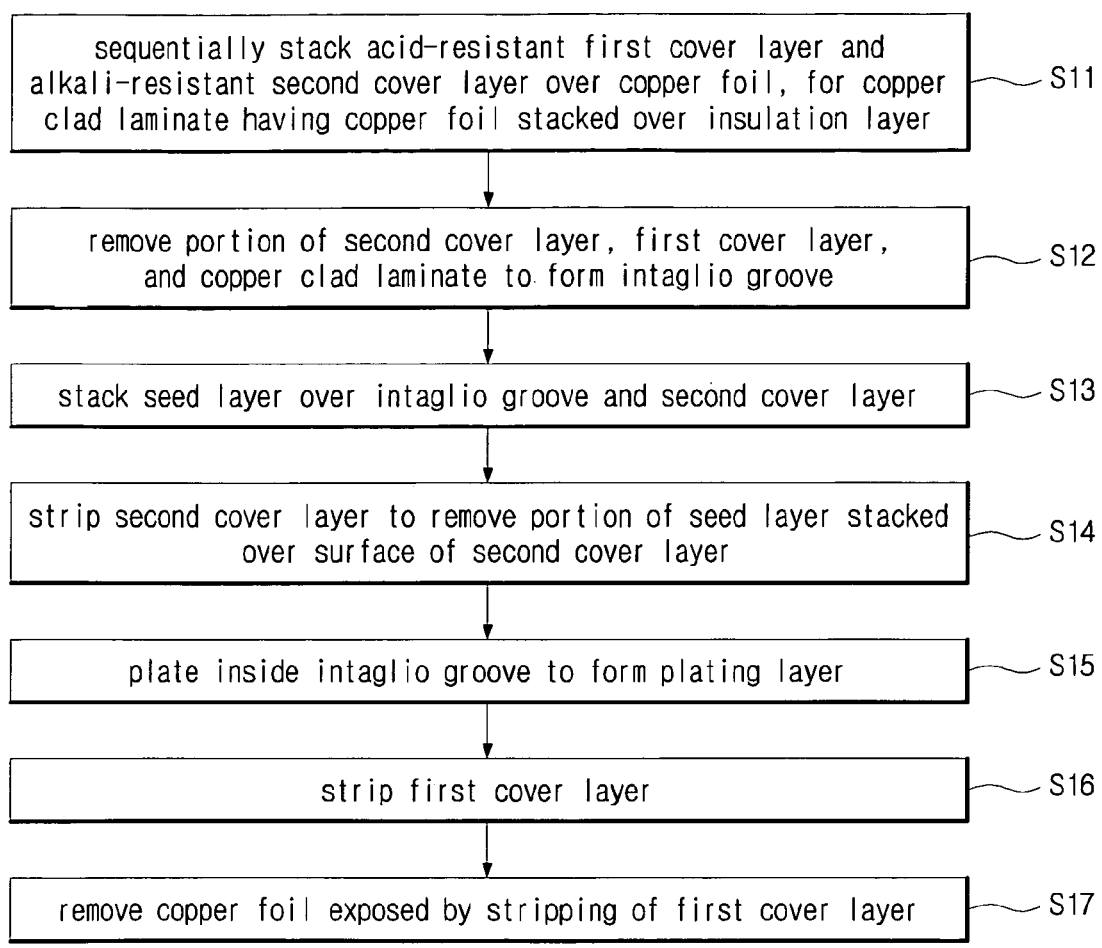
FIG. 2 is a flowchart for a method of manufacturing a printed circuit board according to an embodiment of the invention.

FIG. 2 is a flowchart for a method of manufacturing a printed circuit board according to an embodiment of the invention, while FIG. 3 through FIG. 9 are drawings representing a process flow diagram for a method of manufacturing a printed circuit board according to an embodiment of the invention. In FIGS. 3 to 9, there are illustrated a copper clad laminate 10, copper foils 11, 13, an insulation layer 12, a first cover layer 14, a second cover layer 15, an intaglio groove 16, a seed layer 17, and a plating layer 18.

Figure 3:
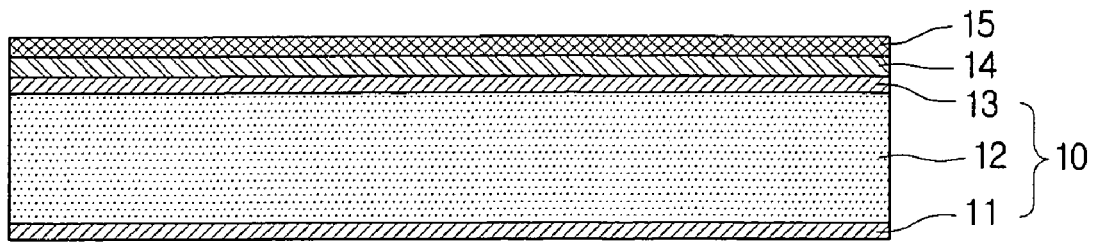
FIG. 3, FIG. 4, FIG. 5, FIG. 6, FIG. 7, FIG. 8, and FIG. 9 are drawings representing a process flow diagram for a method of manufacturing a printed circuit board according to an embodiment of the invention.

Operation S11 may include, for a copper clad laminate in which a copper foil is stacked over one side of an insulation layer, sequentially stacking a first cover layer resistant to acid and a second cover layer resistant to alkali over the copper foil. FIG. 3 illustrates an example of a corresponding process.

The copper clad laminate 10 may have the form of copper foils 11, 13 stacked over both sides of an insulation layer 12, and is an electrical material commonly used in printed circuit boards. The copper clad laminate 10 can be a double-sided type, as illustrated for this particular embodiment, or can be a single-sided type, in which a copper foil is stacked over only one side of the insulation layer.

A first cover layer 14, which is resistant to acid, may first be stacked over one side of the copper clad laminate 10, and then a second cover layer, which is resistant to alkali, may be stacked over the first cover layer 14.

A dry film used in semi-additive processes may be used for the first cover layer 14. A dry film used in a semi-additive process is typically resistant to acid. The semi-additive processes, and the dry film used therein, are well known to those skilled in the art, and thus will not be described here in further detail.

A dry film used in full-additive processes may be used for the second cover layer 15. A dry film used in a full-additive process is typically resistant to alkali. The full-additive processes, and the dry film used therein, are well known to those skilled in the art, and thus will not be described here in further detail.

Figure 4:
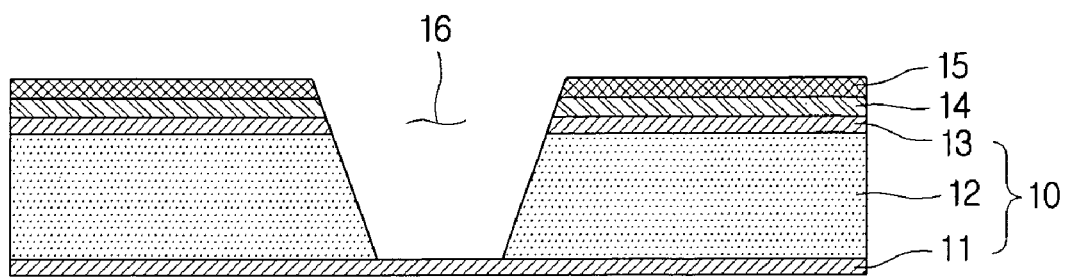

Operation S12 may include removing portions of the second cover layer, first cover layer, and copper clad laminate, to form an intaglio groove. FIG. 4 illustrates an example of a corresponding process.

The intaglio groove 16 may be formed, as illustrated in FIG. 4, using a laser drill. When the inside of the intaglio groove 16 is filled by plating, this will be provided as a circuit pattern. As such, the intaglio groove 16 may be formed in consideration of where the circuit pattern, as well as the pads, etc., is to be placed. Of course, methods known to the public other than laser drilling may also be used.

Figure 5:
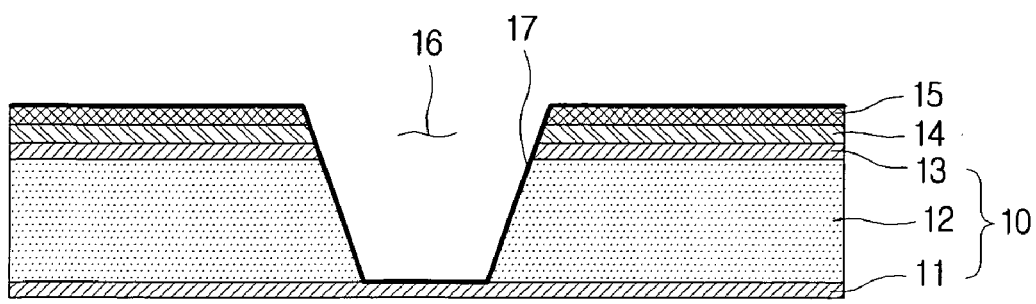

Operation S13 may include stacking a seed layer over the intaglio groove and the second cover layer, where FIG. 5 illustrates an example of a corresponding process.

The seed layer 17 may be formed by electroless plating. As shown in FIG. 5, because the intaglio groove 16 and the second cover layer 15 may be exposed during the electroless plating, the seed layer 17 may also be stacked over the second cover layer 15, which is not directly involved in forming the circuits. The seed layer 17 may be formed by electroless plating performed inside a plating bath. The plating liquid inside the plating bath can be of an alkaline quality. As such, the second cover layer 15, which may be entirely exposed to the plating liquid, may be such that it is resistant to alkali.

Figure 6:
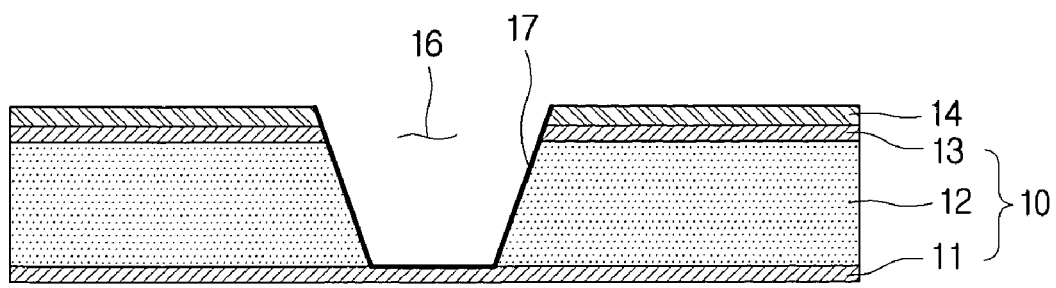

Operation S14 may include stripping the second cover layer to remove a portion of the seed layer stacked over the surface of the second cover layer, where FIG. 6 illustrates an example of a corresponding process. The second cover layer 15 can be stripped by physical force. Alternately, a chemical solution may also be used. When the second cover layer 15 is stripped, the portions of the seed layer 17 positioned over the second cover layer 15 may also be removed. As a result, only the portions of the seed layer 17 positioned inside the intaglio groove 16 may remain.

Figure 7:
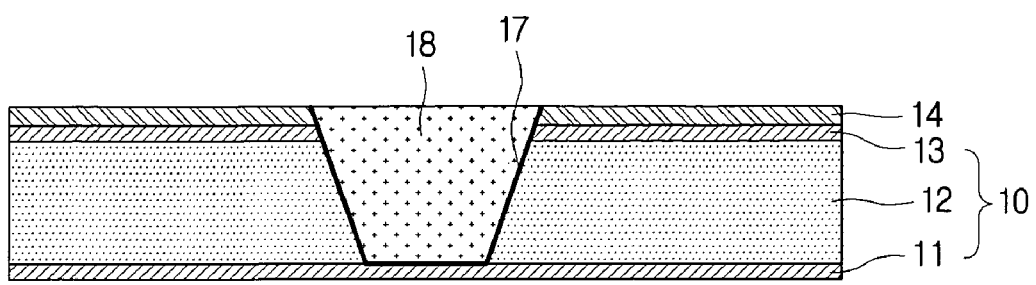

Operation S15 may include plating the inside of the intaglio groove to form a plating layer, where FIG. 7 illustrates an example of a corresponding process. The upper surface of the seed layer 17 may be plated by electroplating. This may result in the intaglio groove 16 being filled with the plating layer 18. Here, the copper foils 11, 13 may be used as lead wires for the plating.

The upper surface of the first cover layer 14, on which there is no seed layer 17, may not be plated.

Figure 8:
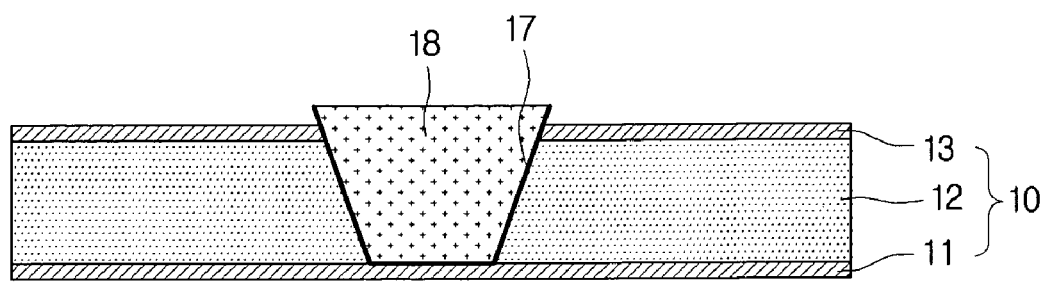

Operation S16 may include stripping the first cover layer, where FIG. 8 illustrates an example of a corresponding process. The first cover layer 14 can be a layer that prevents plating over portions other than the inside of the intaglio groove 16, during the plating process of operation S15. As such, the first cover layer 14 may be stripped after the process of operation S15 has been performed.

Figure 9:
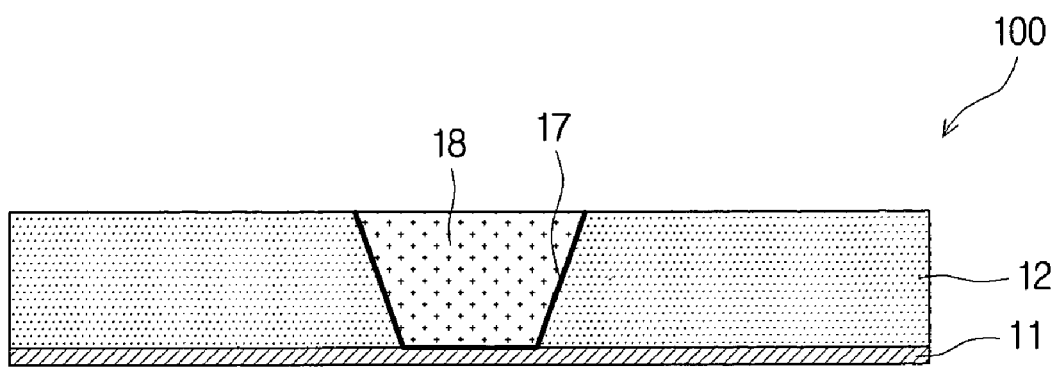

Operation S17 may include removing the copper foil exposed by the stripping of the first cover layer, where FIG. 9 illustrates an example of a corresponding process. The copper foil 13 exposed by the stripping of the first cover layer 14 can be removed by way of etching or grinding. As a result, a printed circuit board 100 may be completed in which a plating layer 18 is formed. The plating layer 18 may serve as the circuit pattern.

According to certain aspects of the invention as set forth above, two cover layers may be used to selectively plate only the intaglio groove. In this way, a printed circuit board can be formed in a simple manner without having to use a photoresist.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board, the method comprising:

stacking an acid-resistant first cover layer over a copper foil, the copper foil stacked over one side of an insulation layer to form a part of a copper clad laminate;

stacking an alkali-resistant second cover layer over the acid-resistant first cover layer;

forming an intaglio groove by removing portions of the second cover layer, the first cover layer, and the copper clad laminate;

stacking a seed layer over the intaglio groove and a total surface of the second cover layer;

removing a portion of the seed layer stacked over the second cover layer by stripping the second cover layer;

forming a plating layer by plating an inside of the intaglio groove;

stripping the first cover layer; and removing the copper foil exposed by the stripping of the first cover layer.

2. The method of claim 1, wherein the removing of the portion of the seed layer comprises stripping the second cover layer by physical force.

3. The method of claim 1, wherein the removing of the copper foil comprises removing the copper foil by etching.

* * * * *